US006888257B2

(12) United States Patent
Wilson et al.

(10) Patent No.: US 6,888,257 B2
(45) Date of Patent: May 3, 2005

(54) INTERFACE ADHESIVE

(75) Inventors: Mark B. Wilson, Indianapolis, IN (US); James H. Hogan, Cary, NC (US); Michael L. Owen, Fishers, IN (US)

(73) Assignee: Lord Corporation, Cary, NC (US)

(*) Notice: Subject to any disclaimer, the term of this patent is extended or adjusted under 35 U.S.C. 154(b) by 87 days.

(21) Appl. No.: 10/184,690

(22) Filed: Jun. 28, 2002

(65) Prior Publication Data
US 2004/0000712 A1 Jan. 1, 2004

(51) Int. Cl.$^7$ ................................................ H01L 23/48
(52) U.S. Cl. ....................... 257/783; 257/687; 257/692; 257/693; 257/706; 257/712; 257/714; 156/307.5; 524/440; 523/458
(58) Field of Search ...................... 523/458; 156/307.5; 524/440; 257/692, 687, 693, 706, 712, 714

(56) References Cited

U.S. PATENT DOCUMENTS

| | | |
|---|---|---|
| 2,705,223 A | 3/1955 | Renfrew et al. |
| 3,159,662 A | 12/1964 | Ashby et al. |
| 3,220,972 A | 11/1965 | Lamoreaux |
| 3,257,342 A | 6/1966 | Kwong |
| 3,410,886 A | 11/1968 | Joy |
| 3,455,877 A | 7/1969 | Plueddemann |
| 3,488,665 A | 1/1970 | MacGrandle et al. |
| 4,070,225 A | 1/1978 | Batdorf |
| 4,082,708 A | 4/1978 | Mehta |
| 4,087,585 A | 5/1978 | Schulz |
| 4,243,706 A | 1/1981 | Williams |
| 4,434,125 A | 2/1984 | Lavender et al. |
| 4,609,574 A | 9/1986 | Keryk et al. |
| 4,749,434 A | 6/1988 | Harrison |
| 4,786,701 A | 11/1988 | Tanaka |
| 5,189,080 A | 2/1993 | Heyke et al. |
| 5,248,710 A | 9/1993 | Shiobara et al. |
| 5,399,739 A | 3/1995 | French et al. |
| 5,416,138 A | 5/1995 | Mogi et al. |
| 5,439,977 A | 8/1995 | Yokata et al. |
| 5,466,848 A | 11/1995 | Childress |
| 5,489,701 A | 2/1996 | Childress et al. |
| 5,575,596 A | 11/1996 | Bauer et al. |
| 5,596,116 A | 1/1997 | Childress et al. |
| 6,046,282 A | 4/2000 | Starner et al. |
| 6,100,114 A | 8/2000 | Milkovich et al. |
| 6,168,972 B1 | 1/2001 | Wang et al. |
| 6,194,788 B1 | 2/2001 | Gilleo et al. |
| 6,228,678 B1 | 5/2001 | Gilleo et al. |
| 6,228,681 B1 | 5/2001 | Gilleo et al. |
| 6,265,471 B1 * | 7/2001 | Dietz ......................... 523/458 |
| 6,265,776 B1 | 7/2001 | Gilleo |
| 6,342,557 B1 | 1/2002 | Suzuki et al. |

* cited by examiner

Primary Examiner—David Nelms
Assistant Examiner—Mai-Huong Tran
(74) Attorney, Agent, or Firm—Miles B. Dearth

(57) ABSTRACT

The invention is directed thermal interfaced die assemblies and 1-component, 96–100% solids, thermosetting, silver-filled thermal interface based on epoxy resins useful for integrated circuit packages enabling conducting heat generated by the die. The adhesive is placed between the die and lid, lid and heat sink and/or die and the heat sink. The interface adhesive composition comprises an inorganic component and an organic component. The inorganic component comprising thermally conductive filler is present at from 70% 85% by weight, and organic component comprises from 60 to 70 wt. % of a diglycidal ether of a bis-phenol compound, 4 to 30 wt. % of an acyclic aliphatic or cycloaliphatic or mononuclear aromatic diglycidal ether, 3 to 30% of a monofunctional epoxy compound, and 20–30% of a polyamine anhydride adduct.

19 Claims, No Drawings

INTERFACE ADHESIVE

FIELD OF THE INVENTION

The invention is directed to one component, 96–100% solids, thermosetting, silver-filled thermal interface based on epoxy resins and useful for integrated circuit packages enabling conducting heat generated by the die. The adhesive can be placed between the die and lid, lid and heat sink (integrated heat spreader), and/or die and the heat sink. With the parts in place, the package is heated to cause the resin to flow and establish contact. Further heating causes curing of the resin and a permanent thermal bridge between the respective parts is formed.

BACKGROUND OF THE INVENTION

Surface mounting of electronic components is well developed in automated package assembly systems. Interface adhesives are used in several approaches to provide lid attach, sink attach and mainly thermal transfer from flip chip devices, as well as against mechanical shock and vibration encountered in shipping and use. As semiconductor devices operate at higher speeds and at lower line widths, the thermal transfer properties of the adhesive are critical to device operation. The thermal interface adhesive must create an efficient thermal pathway between the die or lid and the heat sink as the adhesive itself due to interface resistance ($\theta_{int}$) and bulk resistance ($\theta_{adh}$) is typically the most thermally resistant material in the die-adhesive-lid-adhesive-sink or die-adhesive-sink configuration. The thermal interface adhesive must also maintain efficient thermal transfer properties through reliability testing which simulates actual use conditions over the life of the device. Reliability testing includes exposure for a specified time to a 130° C., 85% relative humidity environment, exposure to an 85° C., 85% relative humidity environment and high temperature storage at 125° C. to 160° C. The adhesive must not delaminate from the substrates or the bulk thermal resistance of the adhesive degrade after exposure to the reliability testing, thereby causing failure of the package. The interface may be applied after the reflow of the metallic or polymeric interconnect and after curing the underfill. A measured amount of interface adhesive will be dispensed usually on the die surface and on the periphery of the carrier substrate in a lidded flip chip assembly ($\theta_{jc}$). The adhesive may also be dispensed on the top of the die surface and the heat sink placed in a die-to-sink application ($\theta_{ja}$). Additionally, the adhesive can be dispensed on the lid surface and the heat sink placed in a sink-to-lid application ($\theta_{ca}$). After the adhesive is dispensed, the adherends are placed with a predetermined pressure and time. The assembly is then heated to cure the adhesive.

Curable adhesives have been made using polyamide resins and epoxy resins as in U.S. Pat. No. 2,705,223 (Renfrew et al.). But the Renfrew compositions possess inferior properties when applied as adhesives. For example, the Renfrew compositions do not possess good adhesive strength upon cure and provide limited working time after the mixing of the components. In addition, such compositions exhibit poor flexibility, and poor adhesive resistance to heat, water and organic solvents when applied to substrates at ambient temperature.

U.S. Pat. No. 3,488,665 (MacGrandle et al.) teaches a process wherein polyamides are blended with epoxies to provide a product which cures after application to the substrate; however, the product is used to provide a hard, stiffer coating for flexible sheet material.

U.S. Pat. No. 4,082,708 (Mehta) teaches an adhesive system comprising an epoxy resin and a polyamide wherein the polyamide is derived substantially from primary and tertiary amines; specifically, the Mehta polyamides are derived from 1,4-bis-primary amino lower alkyl piperazine having terminal primary amine groups. Although it is suggested that secondary amines can be utilized in making the polyamides as chain extenders and flexibilizers, it is taught that the secondary amines are less desirable reactants and should be buried within the polyamide structure.

U.S. Pat. No. 3,257,342 to J. N. S. Kwong teaches a thermoset epoxy resin composition comprising a polyglycidyl ether, an amino-terminated polyamide of (a) polymeric fatty acids and aliphatic dicarboxylic acid and (b) a polyoxyalkylenediamine. Particularly preferred are dimer fatty acids or mixed dimer and trimer acids.

U.S. Pat. No. 4,070,225 to V. H. Batdorf describes a latent or slow-curing adhesive system formulated from an epoxy resin and a primary amine-terminated polyamide. The polyamide was prepared from a polymeric tall oil fatty acid, a polyoxypropyleneamine, 1,4-bis-aminopropyl piperazine, and ethylenediamine.

U.S. Pat. No. 4,082,708 to R. Mehta describes polyamide curatives of epoxy resins prepared from 1,4-bis(3-aminopropyl)piperazine, dimerized tall oil oil fatty acids, polyoxypropylenediamine, and ethylenediamine or piperazine.

The polyamide was used with EPON® 828 as a metal-to-metal adhesive.

U.S. Pat. No. 5,189,080 discloses an encapsulating resin for electronics components consisting of cycloaliphatic epoxy resin, a hardener, an accelerator, a filler, and optionally, a pigment. The hardener can be methylnadic anhydride and the filler can be amorphous silica.

U.S. Pat. No. 5,248,710 discloses flip chip encapsulating compositions comprising an difunctional epoxy resin, a silicone-modified epoxy resin, an imidazole curing agent soluble in epoxy resin, and fused silica filler.

U.S. Pat. No. 5,416,138 discloses epoxy resin compositions for sealing semiconductor devices, essentially, (A) an epoxy resin containing 50–100 weight percent of a diglycidyl ether of a substituted bisphenol (B) a phenolic resin curing agent containing 30–100 weight percent of a flexible phenolic resin curing agent, (C) an inorganic filler and (D) a curing accelerator.

U.S. Pat. No. 5,439,977 discloses an acid anyhdride-containing one package epoxy resin composition consisting indispensably of (1) an epoxy resin having two or more epoxy groups per molecule, (2) an acid anhydride, (3) at least one of (a) a liquid latent curing accelerator, (b) a latent curing accelerator soluble in epoxy resins (c) a latent curing accelerator soluble in acid anhydride and (4) a dispersible latent curing accelerator.

There are a plethora of latent amine curing agents derived from different functional compounds taught for epoxy resin systems. Among these are the blocked or hindered imidazoles, polyamidoamines, polyamide condensates of dimer acids with diethylenetriamine, triethylenetetramine, and aromatic polyamines.

U.S. Pat. No. 6,046,282 discloses a reduced viscosity reactive diluent which is a blend of a high viscosity polyamidoamine epoxy curative and 5 to 95 wt. % of a lower reactive diluent comprising the amide and/or imidazoline reaction product of a polyalkylene polyamine and a $C_2$–$C_7$ aliphatic monocarboxylic acid or a $C_7$–$C_{12}$ aromatic monocarboxylic acid.

U.S. Pat. No. 6,214,460 discloses a screen-printable adhesive composition capable of being applied to a substrate at room temperature comprising at least one alkyl acrylate; at least one reinforcing comonomer, a polyepoxide resin, and a amine adduct with epoxy resin, alkylene epoxides, acrylonitrile, or condensation products with fatty acids or Mannich bases.

U.S. Pat. No. 5,575,596 discloses a rheologically stable, thermal curing flexible electrically-conductive epoxy-based adhesive composition comprising: (a) a polymer mixture comprising at least one polyepoxide resin having a cured hardness not exceeding a Durometer Shore A of 45 and cured with a stoichiometric amount of diethylene triamine, and substantially stoichiometric amount of at least one latent epoxy resin curing agent; and (b) an electrically-conductive filler comprising a metal.

In light of the foregoing, the design of integrated circuit packages heat dissipation is limited by thermal interface materials. Long-term quality defects can arise from many types of failures in the adhesive. Corrosion of nickel-coated copper tungsten lids and aluminum sputtered nickel-coated copper tungsten lids is also a recurring problem. Improvements in thermal interface materials of the 100% solids thermosetting epoxy adhesive type, especially in bond-lines ranging from 75–125 microns would be industrially important to enable higher power loads demanded.

A suitable adhesive must have certain fluid handling characteristics, and exhibit specific adhesion, controlled shrinkage, and low corrosivity in order to provide long term defect-free service over the thermal operating range of the electronic circuit package. Whereas desired properties for thermal interface materials are known such as sharp, well-defined, stable and reproducible Tg, an initial high and stable electrical conductivity, ability to withstand high temperatrue and voltage during repeated "switching" cycles without loss of any of these properties, adhesives fulfilling all of the requirements are not easily found. Wheras it is known to introduce latent thermal curatives to ensure that voids are not left after cure by allowing heating of the resins under vacuum for prolonged periods of time without causing premature gelation, the effects of the crosslinked polymer network on achieving improvements in thermal conductivities is not well understood.

A drawback to highly filled thermosetting epoxy resin compositions currently used in microelectronics applications, such as for underfills, is their extended cure schedule and useful working life at dispensing temperatures and ability to remain at a stable viscosity until curing is initiated. In modern continuous dispensing processes via mechanical pumping devices where a pump has been attributed to the adhesive.

It would be industrially important to provide a 1-part, high solids, thermosetting adhesives adapted to exhibit a controlled shrinkage after curing, and improved post-cure thermal conductivity of 10 W/mK, and above.

A variety of thermally conductive fillers have been employed conventionally with epoxy resins containing solvents and approach or exceed this level of bulk thermal conductivity, however a relatively higher solvent level contributes to worsening shrinkage, void formation, and delamination. Conventional syringe dispensing techniques include time-pressure, positive displacement, and auger-type valve technologies.

It has been found that in a system containing less than 4% volatile components, at a high filler level (70 wt. % and above) in a liquid epoxy adhesive, dispensing equipment malfunctions and is thought to result from a loss of fluidity of a portion of the highly filed epoxy adhesive within the dispensing device.

Provided that a stable adhesive can remain free flowing during continuous dispensing, a balance of properties in the cured solid-phase thermal interface adhesive are needed and are affected by the polymer composition. Besides maintaining filler level above 70 wt. % in a free flowing fluid, the organic components also contribute significantly to the resulting cured thermal conductivity, shrinkage, coefficient of thermal expansion (CTE) and therefore essential for long term, defect-free service in the assembled devices after thousands of temperature cycled from as low as −55° to as high as 125° C.

Certain of the technical problems associated with providing a 1-part curable epoxy adhesive capable of being dispensed to obtain a thin bond-line between the die and lid, or between the lid and heat sink of from about 20 $\mu$ to 150 $\mu$ are overcome by the present invention. Heretofore, bulk thermal conductivity above 10 w/m° K. can be achieved in highly filled thermoset epoxy formulations by the addition of non-reactive solvent, plasticizer or other liquid viscosity reducing diluent, but inclusion of such unreactive diluents result in unacceptable percent shrinkage. It would be industrially important to provide a low viscosity, 100% solids material essentially devoid of solvents, hence low in shrinkage but exhibiting a bulk thermal conductivity of greater than 4 W/m° K., and preferably greater than 10 W/m° K. while exhibiting a volume resistivity of less than 200 mΩ-cm, and preferably up to 100 mΩ-cm.

The critical fluid properties for high speed dispensing of thermal interface embodiments are: viscosity less than about 10,000 poise measured using a Haake® RS1 cone and plate controlled stress rheometer at 25° C. at 2.0 sec$^{-1}$ using a 1°, 35 mm cone. The preferred viscosity in accordance with the invention was observed in a range of from 1200 poise to 6000 poise at 2.0 sec$^{-1}$. The thixotropic index as the ratio of viscosity at 0.2 sec$^{-1}$ to viscosity at 2.0 sec$^{-1}$ is in a range of from 3 to about 7. In a 24-hour period at 25° C. the invention exhibits a viscosity stability of less than 30% viscosity variation over 24 hours. The invention provides sufficient flow and wetting of the dispensed adhesive material to the parts to be bonded when dispensed from a syringe or printed utilizing a screen printer, as practiced on conventional automated assembly lines.

SUMMARY OF THE INVENTION

In one aspect there is provided a 96% to 100% solids, one-component, thermosetting, interface material comprising 75% to 90 wt. % of a thermal conductive filler and from 10% to 25 wt. % of an organic component comprising:

60 to 70 wt. % of a diglycidal ether of a bis-phenol compound 4 to 30 wt. % of an acyclic aliphatic or cycloaliphatic or mononuclear aromatic diglycdal ether having an epoxy equivalent weight of less than 200; 3 to 30% of a monofunctional epoxy compound having an equivalent wt. of less than 250; 20 to 30 wt. % (in a stoichiometric ratio of 0.9–1.3 on total epoxy equivalent weight) of a polyamine anhydride, and optionally from 0.5% to 1.3 wt. % of a hindered imidazole, all percentages adding to 100% representing the organic component.

The proportions of components each contribute to obtaining a unique balance of specified ranges for viscosity, thixotropic index, CTE, shrinkage, thermal conductivity, as illustrated by working embodiments hereinbelow.

In one method of use aspect, the thermal interface material is dispensed by an augur screw dispenser such as available from Asymtek® or Cam-a lot®, by Speedline, through a nozzle and adhered to the undersurface of a lid prior to the contacting the lid to the substrate. With the lid in position over the die, a stable heat bridge is formed by applying heat to the lid, thereby rendering the resin flowable to bridge the gap between the opposing surfaces of the die and the lid, and subsequently curing the resin to solid form.

The cured adhesive provides utility for example, as an alternative to solder for thermal transfer needed to dissipate heat from high-powered electronic devices. The adhesive provides long term reliability, high thermal conductivity, low thermal resistance, low shrinkage, and low out-gassing for high performance flip chip devices as the thermal pathway between the die and the lid, die and the sink, or the lid and the sink. The term 96%–100% total solids is defined by measuring the cumulative weight loss of the adhesive after curing and after exposure to 300° C. of 4 wt. %–0 wt. %.

DETAILED DESCRIPTION OF THE PREFERRED EMBODIMENTS

All percentages specified below are in weight percent and total 100% of the specified component or the total of all components where indicated. The adhesive is thermosetting, which means insoluble with a cured storage modulus range from 1 to 5 gigapascals, and preferably 2 to 4 gigapascalsm as measured by a DMTA.

The interface adhesion composition comprises an inorganic component and an organic component totaling 100% of the adhesive composition. The inorganic component is present at from 70% 85% of the combination of inorganic and organic components. The organic component represents from 15% to 25% by weight of the total. In respect of the organic component in general, this comprises from 60 to 70 wt. % of a diglycidal ether of a bisphenol compound, 4 to 30 wt. % of an acyclic aliphatic or cycloaliphatic or mononuclear aromatic diglycidal ether; 3 to 30% of a monofunctional epoxy compound, and 20–30% of a polyamine anhydride adduct.

Diglycidal Ethers of Bisphenol Compounds

The bisphenol epoxies are diglycidal ethers of compounds such as 2,2-bis-(4-hydroxyphenyl)-propane (bisphenol A), isomer mixtures of dihydroxydiphenyl methane (bisphenol F), bisphenol G, tetrabromobisphenol A,4,4'-dihydroxydiphenyl cyclohexane, 4,4'-dihydroxy-3,3-dimethyldiphenyl propane, 4,4'-dihydroxydiphenyl, 4,4'-dihydroxybenzopenol, bis-(4-hydroxyphenyl)-1,1-ethane, bis-(4-hydroxyphenyl)-1,1-isobutane, bis-(4-hydroxyphenyl)-methane, bis-(4-hydroxyphenyl(-ether, bis-(4-hydroxyphenyl)-sulfone etc. Bisphenol diglycidal ethers are widely available. Included are Bisphenol A epoxy liquid resins under Araldite® GY and PY Bisphenol F epoxy liquids, DER-332 diglycidyl ether of bisphenol A, epoxy equivalent 175, EP-828: diglycidyl ether of bisphenol A, epoxy equivalent 185, EP-807 diglycidyl ether of bisphenol F, epoxy equivalent 170, PY-302-2 diglycidyl ether of bisphenol AF, epoxy equivalent 175, and diglycidyl ether of bisphenol AD, epoxy equivalent 173, including under the ARALDITE® mark of Vantico Ltd. More preferred are electronic grade diglycidal ethers of bisphenols, such as EPICLON® 830S. On the basis of the total weight of the organic component the amount of bisphenol epoxy compound is present at from 60% to 70% and preferably form 62% to 65% by weight.

Difunctional Epoxy Materials

The difunctional resins other than the bisphenol epoxies include acyclic aliphatic diglycidal ethers, cycloaliphatic diglycidal ethers and mononuclear aromatic diglycidal ethers having an epoxy equivalent weight of less than 200. These are widely available commercially. Some non-limiting examples include the aliphatic diglycidal ethers like the diglycidyl ehter of 1,4-butanediol, which has an epoxy equivalent weight of about 130 and available from Shell Chemical Co. of Houston, Tex. under the trade designation Heloxy® 67; (2) the diglycidyl ether of neopentyl glycol, which has an epoxy equivalent weight of about 135 and is available from Shell Chemical Co. under the trade designation Heloxy® 68; (3) the diglycidyl ether of cyclohexane dimethanol, which has an epoxy equivalent weight of about 160 and is available from Shell Chemical Co. under the trade designation Heloxy® 107; and (4) the diglycidyl ether of polyoxypropylene glycol, which has an epoxy equivalent weight of about 190 and is commercially available from Dow Chemical, Midland, Mich., under the trade designation DER® 736, and DER 336, having an epoxy equivalent weight of 182–192 and a viscosity of from 4,000–8,000 cps at 25° C. An exemplary mono mononuclear polyglycidal ehter is resorcinol (1,3-benenediol) diglycidal ether, 1,2-benzenediol (pyrocatechol) diglycidal ether, and 1,4-benzenediol (hydroquinone) diglycidal ether. Amounts of diepoxy compound in excess of 30% leads frequently to dispensing pump failure. Too little diepoxy compound leads to unacceptable viscosity rise, and renders forming bond line thickness specified above difficult to achieve.

The concentration of difunctional epoxy resin gaving epoxy equivalent wt. of less than 200 can be varied within the specified range according to particular selected other components of the adhesive. Preferably however, the amount of difunctional acyclic aliphatic, cycloaliphatic or mononuclear aromatic epoxy with Eq. Wt. less than 200 present in the organic composition is in a range of from 4 wt. % to 10 wt. % of the organic component.

Monofunctional Epoxy Materials

Monofunctional epoxides present in the proportion of from 3 wt. % to 30 wt. %, preferably from 5 wt. % to 10 wt. % of the organic component and are represented by the $C_6$–$C_{20}$ alkylene oxides such as 1,2-hexene oxide, 1,2-heptene oxide, isoheptene oxide, 1,2-octene oxide, 1,2-dodecane monoxide, 1,2-pentadecene oxide, butadiene monoxide, isoprene monoxide, styrene oxide, and represented by monoglycidyl ethers of aliphatic, cycloaliphatic and aromatic alcohols such as methyl glycidyl ether, ethylglycidyl ether, $C_{12}$,$C_{14}$ alkyl monoglycidal ethers, phenyl glycidyl ehter, n-butyl glycidyl ether, cresyl glycidyl ether, isopropyl glycidyl ether, tolyl glycidyl ether, glycidoxypropyltrimethoxysilane, octyl glycidyl ether, nonyl glycidyl ether, decyl glycidyl ether, dodecyl glycidyl ether, p-tert-butylphenyl glycidyl ether, o-cresyl glycidyl ether, and the like. Monoepoxy esters such as the glycidyl ester of monocarboxylic acids, such as versatic acid (commercially available as Cardura® E from Shell Chemical Company), or the glycidyl esters of other acids such as tertiary-nonanoic acid, tertiary-decanoic acid, tertiary-undecanoic acid, etc. are also included. Similarly, if desired, unsaturated monoepoxy esters such as glycidyl acrylate, glycidyl methacrylate or glycidyl laurate could be used. Additionally, monoepoxidized oils can also be used. An excess of monofunctional epoxy compound above the specified level is likely to cause dispenser pump failure and excessive shrinkage leading to delamination. Too little monofunctional epoxy compound leads to unacceptable viscosity rise, and renders forming bond line thickness specified above difficult to achieve.

There are a variety of known amine adducts, or "modified amines", "polyamide", curing agents, as these are termed synonymously. The amide adducts are known and available in a variety of derivatives, however it was observed that cured physical properties are significantly affected by the adduct type. Broadly the conventional polyamine adducts are made from active hydrogen-containing components such as primary and secondary amines. Examples in the literature include adducts of an amine with epoxy resin, adducts of amine with alkylene epoxides or acrylonitrile and condensation reaction products of an amine with fatty acids or Mannich bases. A surprising balance of properties are achieved in the invention by employing a polyamine anhydride adduct. the polyamine adduct must have an elevated melting point from 60° C. up to 200° C. depending upon selection and becomes activating for curing in the molten state. Reaction through the amine groups is believed to predominate rather than the anhydride under the conditions as practiced in accordance with the invention. the preparation utilizes a condensation reaction and is favored over salt formation by the continuous removal of water or other by-products of the condensation, according to conventional practices well known in the art.

The polyamines used to make the polyamide are preferably diamines or comprise diamines. Two or more differing diamines can ordinarily be used in reaction with the anhydride to form the polyamine adduct. The usable polyamines include saturated aliphatic polyamines. A brief listing of a few exemplary diamines among the myriad types known are dialkylenetriamines, especially diethylenetriamine (DETA), trialkylenetetramines and tetraalkylenepentamines, the alkylene moieties preferably being ethylene or alkoxyethylene moieties, e.g., ethylene diamine, diethylene triamine, and triethylene tetraamine; also 1,6-diamino hexane, 1,3-diamino propane, imino-bis(propyl amine), methyl imino-bis(propyl amine) and the like are suitable. Many available polyoxyalkylenediamines available are characterized the formula

wherein x may vary widely ranging from 2 to typically 20. Where X is about 5.6 the commercial material is Jeffamine® D-400 or for x=2.6 it is Jeffamine D-230, ex. Huntsman. Other diamines are 1,2-propylene diamine, 1,3-propylene diamine, 1,4-butane diamine, 1,5-pentane diamine, 1,3-pentane diamine, 1,6-hexane diamine, 3,3,5-trimethyl-1,6-hexanediamine, 3,5,5-trimethyl-1,6-haexane diamine, 2-methyl-1,5-pentane diamine, bis-(3-aminopropyl)-amine, N,N'-bis-(3-aminopropyl)-1,2-ethane diamine, N-(3-aminopropyl)-1,2-ethane diamine, 1,2-diaminocyclohexane, 1,3-diaminocyclohexane, 1,4-diaminocyclohexane, aminoethyl piperazines, the poly(alkylene oxide)diamines and triamines (such as, for example, Jeffamine D-2000, Jeffamine D-4000, Jeffamine T-403, Jeffamine EDR-148, Jeffamine EDR-192, Jeffamine C-346, Jeffamine ED-600, Jeffamine ED-900, Jeffamine ED-2001), meta-xylyene diamine, phenylene diamine, 4,4'-diaminodiphenyl methane, toluene diamine, isophorone diamine, 3,3'-dimethyl-4,4'-diaminodicyclohexyl methane, 4,4'-diaminodicyclohexylmethane, 2,4'-diaminodicyclohexyl methane. Branched aliphatic diamines are likewise usable, an example being trimethylhexamethylenediamine. Entire amines can each be substituted by $C_{1-14}$-alkyl, preferably $C_{1-12}$-alkyl, radicals on the carbon skeleton.

As examples of polyoxyalkylene diamines are, for example polyoxyethylene diamine, polyoxypropylene diamine, polyoxybutylene diamine, polyoxypropylene/polyoxyethylene block and random copolymer diamine, polyoxypropylene/polyoxyethylene/polyoxypropylene block copolymer diamine, polyoxybutylene/polyoxyethylene/polyoxybutylene block copolymer diamine, polyoxybutylene/polyoxypropylene/polyoxybutylene block copolymer diamine, polyoxypropylene/polyoxybutylene/polyoxypropylene block copolymer diamine, polyoxyethylene/polyoxybutylene block or random copolymer diamine and polyoxypropylene/polyoxybutylene block or random copolymer diamine. The polyoxybutylene may contain 1,2-oxybutylene, 2,3-oxybutylene or 1,4-oxybutylene units. The length of the polyoxyalkylene blocks, i.e. the number of oxyalkylene groups in the block, may vary widely, and typically from 2–20, preferably 2–6.

The anhydride may be saturated aliphatic or cycloaliphatic or aromatic and may contain from 3 to 12 carbon atoms, such as the following non-exhaustive list: phthalic anhydride (PA), hexahydrophthalic anhydride, trimellitic anhydride, succinic anhydride, chlorendic anhydride, alkenyl succinic anhydride, and substituted alkenyl anhydrides such as octenyl succinic anhydride, oxalic, malonic, succinic, glutaric, adipic, pimelic, suberic, azelaic, sebacic anhydrides, and mixtures of any of the foregoing.

More preferably, the polyamide adduct has a molecular weight of 1,000 or less, and most preferably less than 500. The most preferred polyamine anhydride adduct has the structure

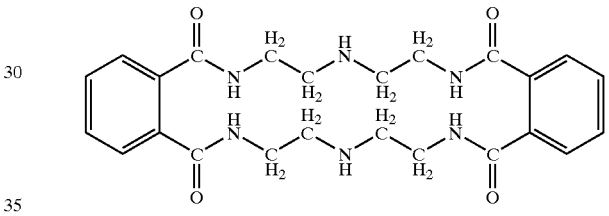

This material is available from Ciba Specialty Chemicals. The recommended stoichiometric ratio of polyamine adduct to total epoxy equivalent weights are from 0.9 to 1.3. Preferably the amount of polyamine adduct is in a wt. percent range of from 23% to 25% on total weight of the organic component of the adhesive.

Most embodiments of the invention contain one or more filler, the selection of which is dependent upon on the particular end-use intended as disclosed herein. The embodiments adapted as thermal interface adhesive contain from 75% to 90% by weight on the total interface material weight (organic and inorganic) of thermal conductive particulate filler. Available thermally conductive particulate fillers include silver, alumina, aluminum nitride, silicon nitride, boron nitride, silicon carbide, and combinations thereof. The thermally conductive particulate materials include versions having particles of diameters ranging from about 5 microns to about 20 microns. Preferred are combinations of silver flakes and powdered silver optionally in combination with a filler selected form the group consisting of graphite, metal oxide, metal carbide, metal nitride, carbon black, nickel fiber, nickel flake, nickel beads and copper flake. The most preferred filler is a combination of silver flake, silver spheres, and graphite. Graphite is optionally employed at from 0.1% to 5 wt. % of the inorganic component. In a more preferred embodiment the organic component is combined with a thermal conductive filler which is a combination of metallic silver flake and silver powder, wherein the wt. ratio of flakes to powder is from 5:1 to 20:1. In another preferred embodiment silver flake, silver powder and graphite comprise the thermal conductive filler.

In adhesive embodiments such as encapsulants, other than silver-filled thermal interfaces, inorganic oxide powders such as fused silica powder, alumina and titanium oxides, and nitrates of aluminum, titanium, silicon, and tungsten are present excluding silver. The use of these fillers will result in different rheology as compared with the low viscosity silver-filled thermal interface adhesive embodiments but the organic component provides moisture absorption resistance. These fillers may be provided commercially as pretreated with a silane adhesion/wetting promoter.

Other additives which are not essential, will be typically included in commercial practice, as some of the examples below illustrate. Additives such as carbon black or a tinting agent or coloring agent, adhesion promoters, wetting agents and the like can be included. One or more types of functionalized organosilane adhesion promoters are preferably employed directly and/or included as an aforementioned pretreatment to fillers as a tie-coat between the particulate fillers and the curable components coating of the invention. The silane additives employed typically at 1 to 3 wt. % of the organic component directly to provide adhesion promoting and wetting improvement between the fluid adhesive and the substrates to be bonded. Representative organofunctional silane compounds useful in the present invention can include (A) hydrolysis reaction products of a tetraalkoxysilane, an organopolysiloxane containing at least one alkenyl radical or silicon-bonded hydrogen atom and an acryloxy-substituted alkoxysilane as is taught in U.S. Pat. No. 4,786,701; (B) alloy silane adducted with acrylate or methacrylate; (C) a combination of epoxy- and vinylfunctional organosilicon compounds as described in U.S. Pat. 4,087,585; (D) an epoxyfunctional silane and a partial allyl ether of a polyhydric alcohol.

Ethylenically-unsaturated organopolysiloxanes and organohydrogenpolysiloxanes are taught in U.S. Pat. No. 3,159,662; U.S. Pat. No. 3,220,972; and U.S. Pat. No. 3,410,886. Preferred ethylenically-unsaturated organopolysiloxanes are those containing higher alkenyl groups such as those described by Keryk et al., U.S. Pat. No. 4,609,574. The disclosures of these references with respect to the ethylenically-unsaturated organopolysiloxane organohydrogenpolysiloxane crosslinking agents disclosed therein are incorporated herein by reference.

Also suitable are epoxy-substituted organosilane or a polyorganosiloxane and contain at least one epoxy group and a hydrolyzable group, each bonded to a silicon atom. The epoxy group is bound by means of an alkylene radical containing at least 1 carbon atom. Alternatively, the epoxide group can be part of a carbocyclic ring that is bonded to a silicon atom through an alkylene group. A preferred epoxy functional silane is represented by the formula $R^1$—Si—$R^2$m-$R^{3-m}$ where $R^1$ represents an epoxyalkyl radical or an epoxy-substituted cycloalkyl radical, $R^2$ represents an alkyl radical, $R^3$ represents a hydrolyzable group and m is 0 or 1. Examples of suitable hydrolyzable groups represented by $R^3$ include but are not limited to alkoxy, carboxy, i.e. R'C(O)O— and ketoximo. In preferred embodiments the hydrolyzable groups are alkoxy groups containing from 1 to 4 carbon atoms. Numerous epoxy-functional silanes are described in U.S. Pat. No. 3,455,877, which is incorporated herein by reference. The epoxy-functional silanes are preferably mono(epoxyhydrocarbyl)trialkoxysilanes wherein the carbon atoms of the epoxy group are separated form the silicon atom by an alkylene radical. One example is 3-glycidoxypropyltrialkoxysilane where the alkoxy group is methoxy or ethoxy.

Representative other organofunctional silanes which are suitable as co-curing materials include without limitation those silanes that contain a group bearing an abstractable hydrogen, such as amino, mercapto-, and hydroxy groups.

Representative hydroxyl group-containing silanes have the general structure:

(A)

wherein R in all instances herein is a divalent aliphatic, cycloaliphatic or aromatic saturated or unsaturated radical having from 1 to 20 carbon atoms, and is preferably an alkylene radical having from 1 to 9, most preferably 2 to 4 carbon atoms; $R^1$ is a monovalent aliphatic, cycloaliphatic or aromatic radical having from 1 to 20 carbon atoms, and is preferably selected from the group consisting of alkyl radicals having from 1 to 4 carbon atoms, cycloalkyl radicals having from 4 to 7 ring carbon atoms, and aryl radicals having 6, 10, or 14 nuclear carbon atoms and including such aryl radicals containing one or more substituent alkyl groups having from 1 to 4 carbon atoms; $R^2$ is a monovalent aliphatic, cycloaliphatic or aromatic organic radical containing from 1 to 8 carbon atoms, and is preferably selected from the group consisting of alkyl radicals having from 1 to 4 carbon atoms, and $R^3$—O—$R^4$, where $R^3$ is an alkylene group having from 1 to 4 carbon atoms (methyl, ethyl, propyl, butyl) and $R^4$ is an alkyl group having from 1 to 4 carbon atoms; and a is zero or 1, preferably zero.

Amino-functional silanes are preferred and include those having the

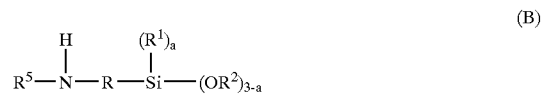

(B)

structure (B)
wherein R, $R^1$, $R^2$, and a are as previously defined for structure (A); and $R^5$ is selected from the group consisting of hydrogen, monovalent aliphatic radicals having from 1 to 8 carbon atoms, monovalent cycloaliphatic radicals having from 4 to 7 carbon atoms and containing one or more substituent alkaryl radicals having 6 nuclear carbon atoms and containing one or more substituent alkyl groups having from 1 to 4 carbon atoms, and $R^6$ NH $R^7$, wherein $R^6$ is selected from the group consisting of divalent aliphatic, cycloaliphatic and aromatic radicals having from 1 to 20 carbons, there being preferably at least two carbon atoms separating any pair of nitrogen atoms, with $R^6$ being preferably an alkylene group of 2 to 9 carbon atoms; and $R^7$ being the same as $R^5$ and preferably is hydrogen. Amino-functional silanes are available under the SILQUEST® trademark.

Sulfur-containing organosilanes are commercially available, such as mercaptofunctional silanes and may be employed. Numerous methods have been described in the art for the preparation of sulfur containing organosilicon compounds. For example, U.S. Pat. No. 5,399,739 disclosing reaction of an alkali metal alcoholate with hydrogen sulfide to form an alkali metal hydrosulfide, which is subsequently reacted with an alkali metal to provide an alkali metal sulfide. The resulting alkali metal sulfide is then reacted with sulfur to provide an alkali metal polysulfide which is then finally reacted with a halogen functional silane. U.S. Pat. Nos. 5,466,848, 5,596,116, and 5,489,701 describe processes for the preparation of silane polysulfides.

Representative specific organosilanes are hydroxypropyltrimethoxysilane, hydroxypropyltriethoxysiane, hydroxybutyltrimethoxysilane, g-aminopropropyltrimethoxysilane, g-aminopropyltripropoxysilane, g-aminoisobutyltriethoxylilane, g-aminopropylmethyldiethoxysilane, g-aminopropylethyldiethoxysilane, g-aminopropylphenyldiethoxysilane, d-aminobutyltriethoxylilane, d-aminobutylmethyldiethoxysilane, d-aminobutylethyidiethoxysilane, g-aminoisobutylmethyldeithoxysilane, N-methyl-g-aminopropyltriethoxysilane, N-phenyl-g-aminopropyl-g-aminopropyltriethoxysilane, N-beta-aminoethyl-g-aminoisobutyltriethoxysilane, N-g-aminopropyl-d-aminobutyltriethoxysilane, N-aminohexyl-g-aminoisobutylmethyldiethoxysilane, methylaminopropyl-thriethoxysilane, g-aminopropylmethoxydiethoxysilnae, gamma-glycidoxypropyl trimethoxysilane, and the like.

The cured glass transition temperature ($T_g$) is not critical, but lies within a range from 20° to 125° C. The preferred embodiments exhibit a $T_g$ in the range of the electronic operating device employing the thermal interface adhesives, which is generally from 20 to 90° C. with an alpha[1] (CTE below the $T_g$) was found to be about 30–70 ppm, while the alpha[2] CTE (above the $T_g$) was no more than 100 ppm, which is within acceptable thermal expansion predicted to provide long term service as a thermal interface at level 1 or level 2 applications.

Exemplary uses- Lid-die Interface

The thermally conductive adhesive which forms the heat bridge between the die and the metal lid can be pre-applied to the lid on the undersurface which will face the die. Lids currently in existence vary widely in length, width and depth, but are generally rectangular in shape, with a peripheral rim or flange which provides a surface along which the lid can be bonded to the substrate. The central portion of the lid is recessed relative to the flange to provide the concave shape, and is generally planar.

Die Attach Adhesives

Die attach adhesives are used to attach semiconductor chips, i.e., to lead frames. Such adhesives must be able to be dispensed in small amounts at high speed and with sufficient volume control to enable the adhesive to be deposited on a substrate in a continuous process for the production of bonded semiconductor assemblies. Rapid curing of the adhesives is very desirable. It is also important that the cured adhesives demonstrate high adhesion, high thermal conductivity, high moisture resistance and temperature stability and good reliability. Conductive die attach adhesives prepared in accordance with the present invention comprise the resin composition of the present invention and at least one conductive filler. Electrically conductive adhesives typically include at least one type of silver flake. Other suitable electrically conductive fillers include silver powder, gold powder, carbon black and the like. For a thermally conductive adhesives (without electrical conductivity) fillers such as silica, boron nitride, diamond, carbon fibers and the like may be used. The amount of electrically and/or thermally conductive filler is sufficient to impart conductivity to the cured adhesive, preferably an amount of from about 20% to about 90% by weight and more preferably from about 40% to about 80% percent by weight. In addition to the electrically and/or thermally conductive filler, other ingredients such as adhesion promoters, anti-bleed agents, rheology modifiers, flexibilizers and the like may be present.

Glob Top Encapsulants

Encapsulants are resin compositions which are used to completely enclose or encapsulate a wire bonded die. An encapsulant prepared in accordance with the present invention comprises the organic component composition of the present invention and non-conductive fillers such as silica, boron nitride, carbon filer and the like. Such encapsulants preferably provide excellent temperature stability, e.g., able to withstand thermocycling from −55° C. to 125° C. for 1000 cycles; excellent temperature storage, e.g., 1000 hours at 150° C.; are able to pass a pressure cooker test at 121° C. at 14.7 p.s.i. for 200 to 500 hours with no failures, and are able to pass a HAST test at 140° C., 85% humidity at 44.5 p.s.i. for 25 hours with no failures.

Heat Sink Adhesive

As mentioned above, the heat cured interface embodiment of the present invention is readily adapted to provide a thermal interface directly between a heat sink or integrated heat spreader, in a semiconductor package and the semiconductor die (Level 1), and between the lid and the heat sink (Level 2).

EXAMPLES

The following recipes were manufactured using a Hauschild® centrifugal mixer.

| Component | Example 1 | Control A | Control B | Control C |
|---|---|---|---|---|
| | Weight parts | | | |
| BIS Phenol F | 0.1276 | 0.1196 | 0.1434 | 0.1391 |
| Anh-amine adduct* | 0.0541 | — | — | — |
| Ancamine 2337[1] | — | 0.0627 | — | — |
| Ancamine 2014 FG[2] | — | — | 0.0352 | — |
| Ajicure MY-24[3] | — | — | — | 0.0393 |
| Curamid CN[4] | — | 0.0010 | 0.0015 | 0.0011 |
| 1,4 Butane Diol DGE | 0.0108 | 0.0101 | 0.0151 | 0.0118 |
| C12, C14 MGE | 0.0136 | 0.0128 | 0.0154 | 0.0149 |
| Dispersant | 0.0008 | 0.0007 | — | 0.0007 |
| Silver flakes | 0.7278 | 0.7278 | 0.7244 | 0.7278 |
| Silver powder | 0.0606 | 0.0606 | 0.0603 | 0.0606 |
| Acrylic silane | 0.0024 | 0.0024 | 0.0024 | 0.0024 |
| Amino silane | 0.0023 1.00 | 0.0023 | 0.0023 | 0.0023 |
| 0.2 sec$^{-1}$ Viscosity (p) | 14380 | 64500 | 6209 | 12200 |
| 2.0 sec$^{-1}$ Viscosity (p) | 2962 | 8260 | 1660 | 2460 |
| Thixotropic Index | 4.85 | 7.8 | 3.74 | 4.96 |
| BTC (W/m ° K.) | 16.8 | ** | 2.87 | 2.00 |

*adduct of DETA-PA
[1]epoxy adduct of an aliphatic polyamine having a primary amino group
[2]epoxy adduct of an aliphatic polyamine having a secondary amino
[3]modified imidazole
[4]hindered 2,4-imidazole (optional)
**Not tested due to very high viscosity.

Viscosity was measured using a Haake® RS1 cone and plate controlled stress rheometer at 25° C. and 0.2 sec$^{-1}$ and 2.0 sec$^{-1}$ using a 1°, 35 mm cone. The viscosity of silver filled examples in accordance with the invention were observed in a range of from 1200 poise to 6000 poise at 2.0 sec$^{-1}$. The preferred viscosity exhibited in preferred embodiments at 2.0 sec$^{-1}$ was 2200 to 3200 poise. Theixotropic index is the ratio of viscosity at 0.2 sec$^{-1}$/viscosity at 2.0 sec$^{-1}$.

Bulk thermal conductivity was measured using a Mathis® Hot Disc. analyzer. The samples were gelled in an aluminum mold for 40 minutes at 150° C., then post-cured for 20 minutes at 150° C. The resultant castings were 0.75 inch (18 mm) in diameter by 0.5 inch (12.7 mm) in depth. The bottom surface of the two castings were then ground and polished to a smooth, parallel finish. The castings were placed into the instrument with the sensor between the two finished surfaces. The samples were clamped in place and a voltage applied through the sensor to determine the temperature rise at the surface. The amount of heat not absorbed by the samples and the applied voltage was used to determine the bulk conductivity of the material through software provided by the equipment. The surprising improvement in thermal conductivities of embodiments in accordance with the invention provided from 5 W/mK to 25 W/mK, and typically 10 to 20 W/mK. Thermal conductivities of from 20–27 W/mK are readily achieved by the inclusion of from 0.5 to 5% of graphite with silver flake and silver powder.

Post-cure shrinkage was measured using a Perkin Elmer® TMA7. A casting of adhesive was prepared by gelling the formulation in an aluminum mold for 40 minutes at 150° C. The sample was removed from the mold and post-cured for an additional 60 minutes at 150° C. The size of the casting was approximately 0.75 inch (18 mm) in diameter by 0.5 inch (12.5 mm) in depth. A band saw was used to remove a portion of the casting approximately 5 mm bt 5 mm by 12.5 mm deep. the top and bottom of the sample was polished to obtain a final sample 5 mm by 5 mm by 10.5 mm deep. The shrinkage was determined for each sample over a 24 hour period up to 125° C. at a temperature ramp from 25° C. to 125° C. at a rate of 10° C./minute followed by an isotherm at 125° C. for 24 hours. The instrument was set to penetration mode with a probe diameter of 3 mm. The force used was 50mN. The percent shrinkage was calculated utilizing the maximum value (probe position) obtained at the beginning of the isotherm and the value at time=1420 minutes. Post cure shrinkage observed in example embodiments range form 0.1 to 1.3%. The following equation yields the shrinkage:

(maximum value−1420 minute value)/maximum value*100%= percent shrinkage

In other examples not illustrated, the proportions of essential components were adjusted outside one or more of the specified organic component ranges and resulted in significantly lower thermal conductivity (3–5 W/mK). For example, increasing the proportion of aliphatic diglycidal ether to about 35%, and reducing bisphenol F diglycidal ether to about 30%, all else equal, cured, bulk thermal conductivity decreased to 4 W/mK. As can be seen by inspection of the control examples that other modified polyamine adducts result in thermal conductivity of 2.87 and 2.0 W/mK, respectively as compared to Example 1 at 16.8 W/mK.

The interface composition is readily adapted to a flip chip package which is formed by connecting a semiconductor chip to a carrier substrate such as a circuit board and sealing the intervening space suitably with the material in accordance with the invention. This semiconductor device mounted at a predetermined position on the carrier substrate provides wire electrodes that are electrically connected by a suitable electrical connection means, such as solder. In order to improve reliability, the space between the semiconductor chip 2 and the carrier substrate 1 is sealed with a thermosetting resin composition 3, and then cured. The cured product of the thermosetting resin composition should completely fill that space.

What is claimed is:

1. A die assembly comprising:
a substrate bearing a semiconductor die, an integrated heat spreader, optional lid
and a thermal interface material comprising a 96% to 100% solids adhesive exhibiting a cured bulk thermal conductivity of 5 to 27 W/mK and comprising 75% to 90% by weight of thermally conductive particulate filler, and from 10% to 25% by weight of organic component, said organic component comprising from 60% to 70% by weight of a diglycidal ether of bisphenol compound, 4 to 30% by weight of a acyclic aliphatic, cycloaliphatic or mononuclear aromatic diglycidal ether having an epoxy equivalent weight of less than 200, from 3% to 30% of a monofunctional epoxy compound having an equivalent weight of less than 250 and from 20% to 30% of a polyamine-anhydride adduct having a melting point of from 60° to 200° C., all percentages totaling 100%.

2. The die assembly according to claim 1 wherein said bisphenol compound is selected from the group consistion of 2,2-bis-(4-hydroxyphenyl)-propane, isomer mixtures of dihydroxydiphenyl methane, bisphenol G, tetrabromobisphenol A, 4,4'-dihydroxydiphenyl cyclohexane, 4,4'-dihydroxy-3,3-dimethyldiphenyl propane, 4,4'-dihydroxydiphenyl, 4,4'-dihydroxybenzopenol, bis-(4-hydroxyphenyl)-1,1-ethane, bis-(4-hydroxyphenyl)-1,1-isobutane, bis-(4-hydroxyphenyl)-methane.

3. The die assembly according to claim 1 wherein said polyamine is selected from the group consisting of diethylenetriamine, triethylenetetramine, tetraethylenepentamine, diethoxyethyleletriamine, triethoxyethylenetetramine, teraethoxyethylenepentamine, ethylene diamine, diethylene triamine, triethtlene tetraamine, 1,6-diamino hexane, 1,3-diamino propane, imino-bis(propyl amine), and methyl imino-bis(propyl amine).

4. The die assembly according to claim 1 wherein said acyclic aliphatic, cycloaliphatic or mononuclear aromatic diglycidal ether is selected form the group consisting of diglycidyl ether of 1,4-butanediol, diglycidyl ether of neopentyl glycol, diglycidyl ether of cyclohexane dimethanol, diglycidyl ether of polyoxypropylene glycol, resorcinol diglycidal ether, 1,2-benzenediol diglycidal ether, and 1,4-benzenediol diglycidal ether.

5. The die assembly according to claim 1 wherein said monofunctional epoxy compound is selected from the group consisting of 1,2-hexene oxide, 1,2-heptene oxide, isoheptene oxide, 1,2-octene oxide, 1,2-dodecane monoxide, 1,2-pentadecene oxide, butadiene monoxide, isoprene monoxide, styrene oxide, methyl glycidyl ether, ethyl glycidyl ether, phenyl glycidyl ether, n-butyl glycidyl ether, cresyl glycidyl ether, isopropyl glycidyl ether, tolyl glycidyl ether, glycidoxypropyltrimethoxysilane, octyl glycidyl ether, nonyl glycidyl ether, decyl glycidyl ether, dodecyl glycidyl ether, $C_{12},C_{14}$ alkyl monoglycidal ether, p-tert-butylphenyl glycidyl ether, o-cresyl glycidyl ether, glycidyl ester versatic acid, glycidyl ester of tertiary-nonanoic acid, glycidyl ester of tertiary-decanoic acid, and glycidyl ester of tertiary-undecanoic acid.

6. The die assembly according to claim 1 wherein said thermally conductive particulate filler selected from the group consisting of silver, alumina, aluminum nitride, silicon nitride, boron nitride, silicon carbide, and combinations thereof.

7. The die assembly according to claim 6 wherein said thermally conductive particulate filler is silver.

8. The die assembly according to claim 7 wherein said thermally conductive particulate filler is a combination of silver flakes and silver powder.

9. A heat cured, thermal interface material comprising an adhesive capable of exhibiting a cured bulk thermal conductivity of 5 to 27 W/mK, comprising 75% to 90% by weight of thermally conductive particulate filler, and from 10% to 25% by weight of organic component, said organic component comprising from 60% to 70% by weight of a diglycidal ether of bisphenol compound, 4 to 30% by weight of a acyclic aliphatic, cycloaliphatic or mononuclear aromatic diglycidal ether having an epoxy equivalent weight of less than 200, from 3% to 30% of a monofunctional epoxy compound having an equivalent weight of less than 250 and from 20% to 30% of a polyamine-anhydride adduct having a melting point of from 60° to 200° C., all percentages totaling 100% of said organic component.

10. The thermal interface material according to claim 9 wherein said bis phenol compound is selected from the group consisting of 2,2-bis-(4-hydroxyphenyl)-propane, isomer mixtures of dihydroxydiphenyl methane, bisphenol G, tetrabromobisphenol A, 4,4'-dihydroxydiphenyl cyclohexane, 4,4'-dihydroxy-3,3-dimethyldiphenyl propane, 4,4'-dihydroxydiphenyl, 4,4'-dihydroxybenzopenol, bis-(4-hydroxyphenyl)-1,1-ethane, bis-(4-hydroxyphenyl)-1,1-isobutane, bis-(4-hydroxyphenyl)-methane.

11. The thermal interface material according to claim 9 wherein said polyamine of said adduct is the residue of a polyamine selected from the group consisting of diethylenetriamine, triethylenetetramine, tetraethylenepentamine, diethoxyethylenetriamine, triethoxyethylenetetramine, tetraethoxyethylenepentamine, ethylene diamine, diethylene triamine, triethylene tetraamine, 1,6diamino hexane, 1,3-diamino propane, imino-bis(propyl amine), and methyl imino-bis(propyl amine).

12. The thermal interface material according to claim 9 wherein said acyclic aliphatic, cycloaliphatic or mononuclear aromatic diglycidal ether is selected form the group consisting of diglycidyl ether of 1,4-butanediol, diglycidyl ether of neopentyl glycol, diglycidyl ether of cyclohexane dimethanol, diglycidyl ether of polyoxypropylene glycol, resorcinol diglycidal ether, 1,2-benzenediol diglycidal ether, and 1,4-benzenediol (hydroquinone) diglycidal ether.

13. The thermal interface material according to claim 9 wherein said monofunctional epoxy compound is selected from the group consisting of 1,2-hexene oxide, 1,2-heptene oxide, isoheptene oxide, 1,2-octene oxide, 1,2-dodecane monoxide, 1,2-pentadecene oxide, butadiene monoxide, isoprene monoxide, styrene oxide, methyl glycidyl ether, ethyl glycidyl ether, phenyl glycidyl ether, n-butyl glycidyl ether, cresyl glycidyl ehter, isopropyl glycidyl ether, tolyl glycidyl ether, glycidoxypropyltrimethoxysilane, octyl glycidyl ether, nonyl glycidyl ether, decyl glycidyl ether, dodecyl glycidyl ether, $C_{12},C_{14}$alkyl monoglycidal ether, p-tert-butylphenyl glycidyl ether, o-cresyl glycidyl ether, glycidyl ester versatic acid, glycidyl ester of tertiary-nonanoic acid, glycidyl ester of tertiary-decanoic acid, and glycidyl ester of tertiary-undecanoic acid.

14. The thermal interface material according to claim 9 wherein said thermally conductive particulate filler selected from the group consisting of silver, alumina, aluminum nitride, silicon nitride, boron nitride, silicon carbide, and combinations thereof.

15. The thermal interface material according to claim 14 wherein said thermally conductive particulate filler is silver.

16. The thermal interface material according to claim 15 wherein said thermally conductive particulate filler is a combination of silver flakes and silver powder.

17. The thermal interface material according to claim 9 which exhibits a viscosity at 25° C. of less than about 10,000 poise (Haake® RS1 cone and plate controlled stress rheometer at 25° C. at 2.0 $sec^{-1}$ using a 1°, 35 mm cone).

18. The thermal interface material according to claim 9 wherein said polyamine anhydride adduct has the structure

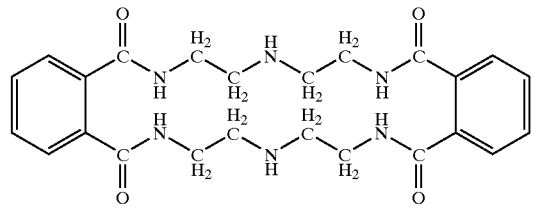

19. The thermal interface material of claim 9 wherein said diglycidal ether of bis phenol is the diglycidal ether of Bisphenol F, said acyclic aliphatic, cycloaliphatic or mononuclear aromatic diglycidal ether is selected from the group consisting of 1,4 butane diol diglycidal ether cylohexane dimethanol diglycidal ether, and resorcinol diglycidal ether, said monofunctional epoxy is selected from the group consisting of 1,2-hexene oxide, 1,2-heptene oxide, isoheptene oxide, 1,2-octene oxide, 1,2-dodecane monoxide, 1,2-pentadecene oxide, butadiene monoxide, isoprene monoxide, styrene oxide, methyl glycidyl ether, ethyl glycidyl ether, phenyl glycidyl ether, n-butyl glycidyl ether, cresyl glycidyl ether, isopropyl glycidyl ether, tolyl glycidyl ether, glycidoxypropyltrimethoxysilane, octyl glycidyl ether, nonyl glycidyl ether, decyl glycidyl ether, dodecyl glycidyl ether, $C_{12},C_{14}$alkyl monoglycidal ether, p-tert-butylphenyl glycidyl ether, o-cresyl glycidyl ether, glycidyl ester versatic acid, glycidyl ester of tertiary-nonanoic acid, glycidyl ester of tertiary-decanoic acid, and glycidyl ester of tertiary-undecanoic acid.

* * * * *